(12) United States Patent
Lin et al.

(10) Patent No.: US 11,773,319 B2
(45) Date of Patent: Oct. 3, 2023

(54) QUANTUM DOT PARTICLES WITH PASSIVATION LAYER AND MANUFACTURING METHOD THEREOF

(71) Applicant: SKY TECH INC., Hsinchu County (TW)

(72) Inventors: Jing-Cheng Lin, Hsinchu County (TW); Jung-Hua Chang, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 216 days.

(21) Appl. No.: 17/465,561

(22) Filed: Sep. 2, 2021

(65) Prior Publication Data

US 2023/0069110 A1 Mar. 2, 2023

(51) Int. Cl.
| | |
|---|---|
| *C09K 11/02* | (2006.01) |
| *C23C 16/455* | (2006.01) |
| *C23C 16/40* | (2006.01) |
| *B82Y 40/00* | (2011.01) |
| *B82Y 30/00* | (2011.01) |
| *B82Y 20/00* | (2011.01) |

(52) U.S. Cl.
CPC .......... *C09K 11/025* (2013.01); *C23C 16/403* (2013.01); *C23C 16/45553* (2013.01); *B82Y 20/00* (2013.01); *B82Y 30/00* (2013.01); *B82Y 40/00* (2013.01); *C01P 2004/80* (2013.01)

(58) Field of Classification Search
CPC ............ C09K 11/025; C23C 16/45553; C23C 16/403; C01P 2004/80
See application file for complete search history.

(56) References Cited

U.S. PATENT DOCUMENTS

| | | | |
|---|---|---|---|
| 2016/0268483 A1* | 9/2016 | Theobald | H01L 33/502 |
| 2021/0032534 A1* | 2/2021 | Sun | B82Y 40/00 |

* cited by examiner

*Primary Examiner* — C Melissa Koslow
(74) *Attorney, Agent, or Firm* — Chun-Ming Shih; HDLS IPR SERVICES

(57) ABSTRACT

The present disclosure provides a quantum dot particle with passivation layer, which mainly includes a one quantum dot (QD) particle, a first-passivation layer and a second-passivation layer, wherein the first-passivation layer is disposed on a surface of the QD particle, and the second-passivation layer is disposed on a surface of the first-passivation layer. A precursor chosen for forming the first-passivation layer does not cause damage to the QD particle. A precursor of the second-passivation layer includes a composition of trimethylaluminum (TMA) and water, or TMA and ozone, wherein a density of the second-passivation layer is greater than that of the first-passivation layer. The precursor of the second-passivation layer is kept out by the first-passivation layer, such that to prevent the precursor of the second-passivation layer from contacting the QD particle and causing deterioration thereto, and hence to improve a life cycle of the QD particle.

19 Claims, 3 Drawing Sheets

QUANTUM DOT PARTICLES WITH PASSIVATION LAYER AND MANUFACTURING METHOD THEREOF

TECHNICAL FIELD

The present disclosure relates to a quantum dot particle with passivation layer and a manufacturing method thereof, which has a passivation layer to effectively protect the quantum dot particles, to facilitate improving a production yield and life cycle of the quantum dot particle.

BACKGROUND

A nanoparticle is defined as a particle smaller than 100 nanometer (nm) in at least one dimension, which shows entirely different physical and chemical properties comparing with that in macroscopic scale. Generally, macroscopic matters have all the same physical property, no matter what size they are, however neither do the nanoparticle. Such that, the nanoparticles hold useful potentials in technic fields of biomedicine, optics and electronics, etc.

Quantum dot (QD) particles are semiconductor nanoparticles. Nowadays, II-VI semiconductor materials, such as zinc sulfide (ZnS), cadmium sulfide (CdS) and cadmium selenide (CdSe) are under research, especially the CdSe. A common size of the QD particle is between 2 nm and 50 nm, and when the QD particle is exposed to ultraviolet (UV) light, electrons of the QD particle absorb energy from the UV light and jump from their valence band to their conduction band, then release the energy by emitting light and fall back to the ground state.

The QD particle possesses a band gap which is size-concerned, when size of the QD particle is larger, the band gap is smaller as so to emit light with longer wavelength. Then, when the size of the QD particle is smaller, the band gap is larger as so to emit light with shorter wavelength. For example, QD particle with a size of 5 nm~6 nm emits orange or red light, QD particle with a size of 2 nm~3 nm emits blue or green light, the light color may also be defined by ingredient of the QD particle.

A light-emitting diode employing QD particles can generate light with proximately continuous spectrum, at same time with high color-rendering index (CRI), which improves a quality of light emission. Also, the wavelength of the emitted light can be adjusted via changing size of the QD particle. Therefore, the QD particles are significant for development of new-generation lighting devices and displays.

Despite of such advantages and features, the QD particles may have agglomeration problem occurred often in manufacturing process thereof. Moreover, QD particles have high surface activity, which can easily react with air and water vapor and shorten a lifetime of the OD particles.

To be specific, in a process of encapsulating QD particles by gel to construct light-emitting diode (LED), agglomeration may occur to disrupt optical performance of the QD particles. Also, after gel-encapsulating the QD particles for constructing the LED, environmental oxygen or water vapor may still sneak through the gel layer and contact surfaces of the QD particles, which causes oxidation of the QD particles and hence shorten the lifetime of the QD particles so as the LED. Moreover, defects and dangling bonds on the surfaces of the QD particles may cause non-radiative recombination problem.

Modern industries employ an atomic layer deposition (ALD) process to surfaces of quantum dots to form an 1-nanometer-thick thin film thereon, such that to protect the QD particles. However, the thin film based on the modern technology can only provide limited protection to the QD particles, and therefore not enough for prolonging the life cycle thereof.

SUMMARY

To overcome the abovementioned problems, this disclosure provides a quantum dot particle with passivation layer (QDPPL), which is mainly formed with a first-passivation layer and a second-passivation layer on a surface of a quantum dot (QD) particle sequentially. Also, a precursor for forming the first-passivation layer does not include water or any ingredient that may cause damage to the QD particle, such that to avoid the QD particle from soaking or deterioration during a manufacturing process thereof.

An object of the present disclosure is to provide a QDPPL, which mainly includes at least one QD particle, at least one first-passivation layer and at least one second-passivation layer, wherein the first-passivation layer and the second-passivation layer are sequentially disposed on a surface of the QD particle. A precursor of the first-passivation layer does not include water or any ingredient that may cause damage to the QD particle, thereby to prevent the QD particle from soaking and deteriorating during a process of forming the first-passivation layer.

As the first-passivation layer is already formed on the surface of the QD particle before forming the second layer, the first-passivation layer can quarantine a precursor applied to dispose the second-passivation layer which may include a composition of water and Trimethylaluminium (TMA), or ozone and TMA, such that to prevent the QD particle from directly contacting the precursor of the second-passivation layer and soaking, deteriorating, or even just replace the water with the ozone.

An object of the present disclosure is to provide a QDPPL, which mainly includes at least one QD particle, at least one first-passivation layer and at least one second-passivation layer, wherein the first-passivation layer and the second-passivation layer are sequentially disposed on the QD particle. The first-passivation layer contacting the QD particle, which has a relatively loose density, for preventing the QD particle from contacting water vapor or any ingredient that may cause damage to the QD particle and hence to soak or deteriorate. The second-passivation layer disposed on a surface of the first-passivation layer, which has a relatively tight density, for a stronger protection to the QD particle and prolonging a life cycle thereof.

The precursor of the first-passivation layer includes TMA and alcohol, such that the first-passivation layer has high carbon content. The precursor used in the second-passivation layer includes a composition of water and TMA, or ozone and TMA, such that the second-passivation layer has low carbon content.

An object of the present disclosure is to provide a manufacturing method of QDPPL, which includes a step of forming a first-passivation layer on a surface of the QD particle via an atomic-layer deposition (ALD) process, wherein the precursor of the first-passivation layer does not include water or any ingredient that may cause damage to the QD particle, such that to prevent the QD particle from contacting the water or any ingredient that may cause damage and then to soak and deteriorate, during a process of disposing the first-passivation layer.

After disposing the second-passivation layer, inspect if the QD particle ever soaks and has color change, to decide a result of the ALD, such as to blend, mix the QDPPL with a silica gel and paste on a light-emitting diode (LED) carrier, thereafter to inspect if the LED carrier has blackened. If the LED carrier blackens, it shows that the passivation layer(s) does not cover the QD particle entirely, such that zinc sulfide (ZnS) on the surface of the QD particle has reacted with silver on the LED carrier.

An object of the present disclosure is to provide the aforementioned manufacturing method of QDPPL, wherein the QD particle is formed with a protection layer (e.g. silicon dioxide), for preventing the precursor of the first-passivation layer from directly contacting the QD particle. Thereby, the precursor for forming the first-passivation layer can be more free to choose, such as TMA and water are also applicable.

Alternatively, the QD particle may be made of ingredients that is water-repel or water-proof, such that no reaction with the water vapor for at least a duration, and thus the precursor for forming the first-passivation layer can be more free to choose, such as TMA and water are also applicable.

To achieve the abovementioned object, the present disclosure provides a QDPPL, which includes: at least one QD particle; a first-passivation layer disposed on a surface of the QD particle; and a second-passivation layer disposed on a surface of the first-passivation layer, wherein a density of the second-passivation layer is greater than first-passivation layer.

The present disclosure provides a manufacturing method of QDPPL, which includes steps of: providing at least one QD particle; performing a first ALD to the QD particle, to form a first-passivation layer on the surface of the QD particle; and performing a second ALD to the QD particle, to form a second-passivation layer on the surface of the first-passivation layer, wherein the precursor of the second ALD includes a composition of water and TMA, or ozone and TMA.

The present disclosure provides a manufacturing method of QDPPL, which includes steps of providing at least one QD particle; performing an molecular-layer deposition (MLD) to the QD particle, to form a first-passivation layer on a surface of the QD particle; and performing an ALD to the QD particle, to form a second-passivation layer on the surface of the first-passivation layer, wherein a precursor of the ALD includes a composition of water and TMA, or ozone and TMA.

The QDPPL as abovementioned, wherein the first-passivation layer is an organic/inorganic compound layer, the second-passivation layer has a carbon content less than 10%, the first-passivation layer has a carbon content greater or equal to 10%.

The QDPPL as abovementioned, wherein the first-passivation layer has a thickness greater than 0.5 nm.

The QDPPL as abovementioned, wherein the second-passivation layer has a thickness greater or equal to the first-passivation layer.

The manufacturing method of QDPPL as abovementioned, wherein a precursor employed in the first ALD includes TMA and alcohol.

The manufacturing method of QDPPL as abovementioned, wherein a precursor of the first ALD does not include water.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
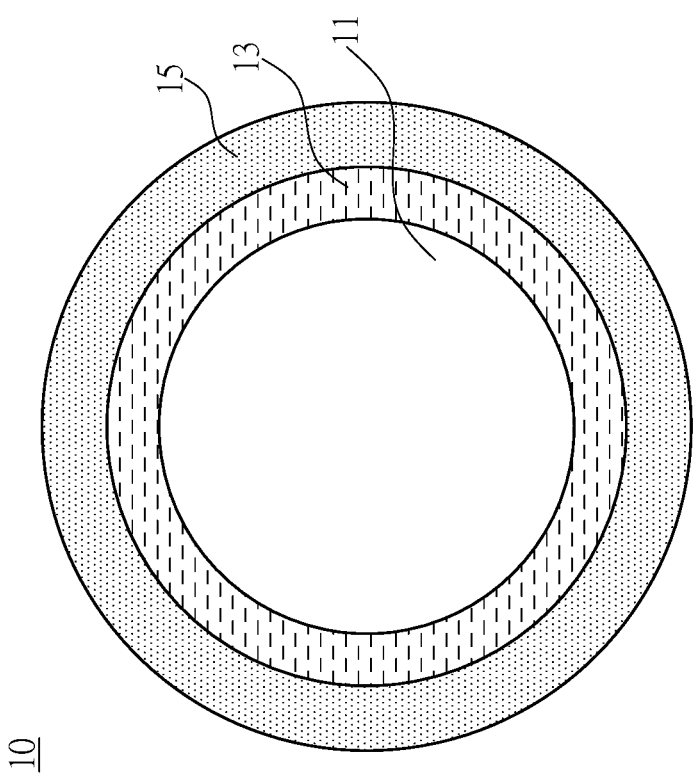
FIG. 1 is a schematic sectional view of a quantum dot particle with passivation layer (QDPPL) according to one embodiment of the present disclosure.

Referring to FIG. 1, which is a schematic sectional view of a quantum dot particle with passivation layer (QDPPL) 10 according to one embodiment of the present disclosure. The quantum dot particle with passivation layer (QDPPL) 10 includes at least one quantum (QD) particle 11, at least one first-passivation layer 13 and at least one second-passivation layer 15. The first-passivation layer 13 is disposed on a surface of the QD particle 11, and the second-passivation layer 15 is disposed on a surface of the first-passivation layer 13.

The QD particle 11 may be made of II-VI semiconductor materials, such as zinc sulfide (ZnS), cadmium sulfide (CdS), cadmium selenide (CdSe), or cadmium-free material, such as indium phosphide (InP), perovskite or copper indium sulfide zinc sulfide (CuInS2), wherein the QD particle 11 has a size generally smaller than 100 nanometer (nm). The first-passivation layer 13 and the second-passivation layer 15 formed on the QD particle 11, both include but are not limited to aluminum oxide (Al2O3).

In one embodiment, the QD particle 11 may be made of certain material that reacts with or effected by water vapor, the first-passivation layer 13 can be formed on a surface of the QD particle 11, via a first atomic-layer deposition (ALD) process. A precursor for forming the first-passivation layer 13 does not include water, but may include Trimethylaluminium (TMA) and alcohol for example. Such that, during the process of performing the first ALD on the surface of the QD particle 11, the QD particle 11 does not contact water and hence be able to avoid soaking and deterioration thereof.

After completing a step 23 of disposing the first-passivation layer 13 on the surface of the QD particle 11 (FIG. 2), a next step 25 is to perform a second ALD to the QD particle 11, to form a second-passivation layer 15 on the surface of the first-passivation layer 13. Before forming the second-passivation layer 15, the first-passivation layer 13 is already formed on the surface of the first-passivation layer 13, wherein the first-passivation layer 13 can be used to quarantine a precursor of the second ALD from the QD particle 11. Therefore, the precursor of the second ALD is relatively optional, wherein a precursor which can form a second-passivation layer 15 with a higher density is the most preferable. Also, the precursor for forming the second-passivation layer 15 may be a composition of TMA and water, or TMA and ozone.

Generally, a precursor such as TMA and alcohol with no water, which can prevent the QD particle 11 from contacting water and deterioration. However, the first-passivation layer 13 is formed with a lower density, which is a disadvantage for prolonging a life cycle of the QD particle 11. In contrary, the precursor employed in the second ALD is optional, such as a composition of TMA and water, which can form the second-passivation layer 15 with a higher density and facilitate to prolong the life cycle of the QD particle 11.

Therefore, according to the present disclosure, the first-passivation layer 13 is priorly formed on the surface of the QD particle 11, thereafter the second-passivation layer 15 is then formed on a surface of the first-passivation layer 13. Even though the precursor for forming the second-passivation layer 15 includes water or ozone, but because of the first-passivation layer 13 which is already formed on the surface of the QD particle 11, therefore it is able to prevent the water or the highly-reactive ozone of the precursor employed in the second ALD from contacting the QD particle 11.

Specifically, the present disclosure applies different precursors in the first ALD and the second ALD. Such that, the first-passivation layer 13 and the second-passivation layer 15 formed on the surface of the QD particle 11, both have different properties and functions, and are able to prevent the QD particle 11 from soaking and deterioration, at same time to provide a better protection for the QD particle 11.

Since the precursors employed in the first ALD and the second ALD are different, ingredients composed into the first-passivation layer 13 and the second-passivation layer 15 are also different. To be specific, the precursor employed in the second ALD, such as the composition of TMA and water, or TMA and ozone, which can cause the second-passivation layer 15 to have a carbon content lower than that of the first-passivation layer 13. For example, the carbon content of the second-passivation layer 15 is less than 10%, and the carbon content of the first-passivation layer 13 is equal to or greater than 10%.

In one embodiment of the present disclosure, the first-passivation layer 13 may be an organic-inorganic hybrid layer. Also, the first-passivation layer 13 is mainly for keeping out water vapor during the ALD process, whereas the second-passivation layer 15 is the main protection for the QD particle 11, thus the second-passivation layer 15 generally has a thickness equal to or greater than that of the first-passivation layer 13, to improve the protection of the QD particle 11. After multiple experiments, it shows that with a thickness greater than 0.5 nm, the first-passivation layer 13 is able to effectively keep out the water included in the precursor used in the second ALD from the QD particle 11, and hence to prevent the QD particle 11 from soaking and deterioration.

The FIG. 1 only shows a single QD particle 11 wrapped and covered by the first-passivation layer 13 and the second-passivation layer 15, however surely, the first-passivation layer 13 and the second-passivation layer 15 may also wrap a plurality of QD particles, in practical use.

In one embodiment, the QD particle 11 may be made of certain material that does not react with water vapor much, such that the precursor of the first-passivation layer 13 may include TMA and water. Thereafter, TMA and ozone may be used as the precursor for forming the second-passivation layer 15. It should be noted that, if directly disposing a passivation layer of TMA and ozone on the QD particle 11 without forming the first-passivation layer 13 in advance, the highly-reactive ozone reacts with the QD particle 11 and hence cause damage or deterioration thereto. Therefore, the first-passivation layer 13 is significant to be formed on the QD particle 11 for protection, such that the second-passivation layer of TMA and ozone can be formed safely thereafter.

In one embodiment, the QD particle 11 may be formed a silica layer which is made of silica and moisture, and thereafter, the first-passivation layer 13 and the second-passivation layer 15 sequentially. By virtue of the silica layer which is formed on the QD particle 11 in advance for a protection thereof, such that to prevent the precursor of the first-passivation layer 13 from directly contacting the QD particle 11, and therefore the precursor can cause no harm thereto. Thereby, the precursor of the first-passivation layer 13 is more free to choose, which can be such as the compositions of TMA and ozone, or TMA and water.

Also to mention that, the precursor of the first-passivation layer 13 including water or ozone (e.g. the composition of TMA and water, or TMA and ozone), which is able to improve a density and relatively stronger protection of the QD particle 11. Furthermore, with the second-passivation layer 15 formed on the surface of the first-passivation layer 13, the protection of the QD particle 11 can be further improved.

Figure 2:
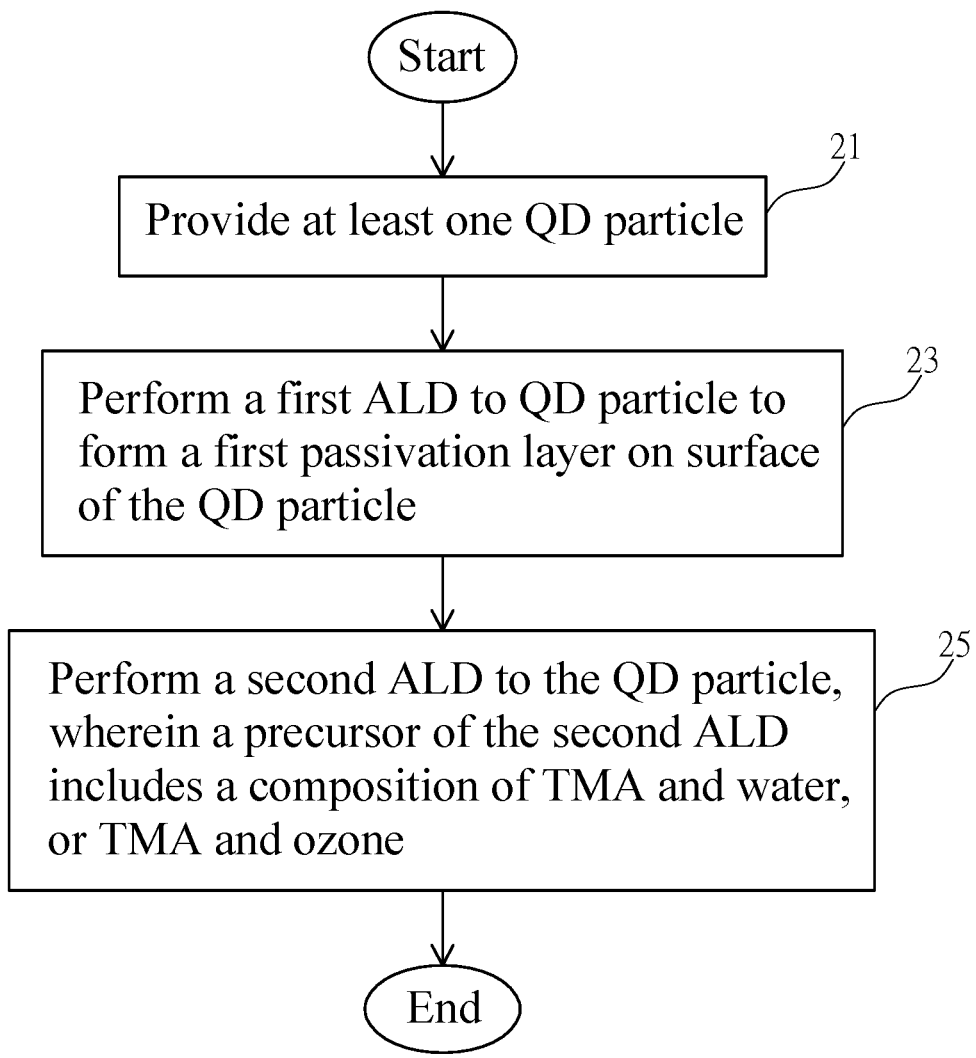
FIG. 2 is a flowchart of a manufacturing method of QDPPL according to one embodiment of the present disclosure.

Referring to FIG. 2, which is a flowchart of a manufacturing method of QDPPL according to one embodiment of the present disclosure. Also referring to FIG. 1, the method is first to provide at least one QD particle 11 as shown in step 21 of FIG. 2. The QD particle 11 may be made of the II-VI semiconductor materials such as ZnS, CdS or CdSe, or those cadmium-free material, such as InP, perovskite or CuInS2, etc., wherein the QD particle 11 generally has a size smaller than 100 nm. The manufacturing method of the QD particle is mainly categorized into three types, as solution growth method, epitaxial growth, and electric field confinement method, however those are not technical features of the present disclosure, thus herein to neglect detailed description.

On next, perform a first ALD to the QD particle 11, and form a first-passivation layer 13 on a surface of the QD particle 11, as shown by step 23 in FIG. 2. In one embodiment of the present disclosure, the precursor used in the first ALD includes no water but TMA and alcohol (however not limited thereto), such that to prevent the QD particle(s) 11 from contacting the water vapor and soaking during the first ALD. Furthermore, without water included in the precursor of the first ALD, this can also prevent agglomeration of the QD particle(s) 11. In one embodiment of the present disclosure, the first-passivation layer 13 may be formed on the surface of the QD particle(s) 11 via molecular-layer deposition, wherein the precursor includes no water but TMA and alcohol, for example.

In a different embodiment, the precursor of the first ALD may include water or ozone, and hence to be such as a composition of TMA and water, or TMA and ozone.

Thereafter to perform a second ALD to the QD particle 11, and form a second-passivation layer 15 on a surface of the first-passivation layer13 disposed on the QD particle 11, wherein a precursor employed in the second ALD includes a composition of TMA and water, or TMA and ozone, as shown by step 25 in FIG. 2. Also, the second-passivation layer 15 formed via the second ALD, which has a density higher than that of the first-passivation layer 13, such that to facilitate increasing the life cycle of the QD particle 11.

Figure 4:
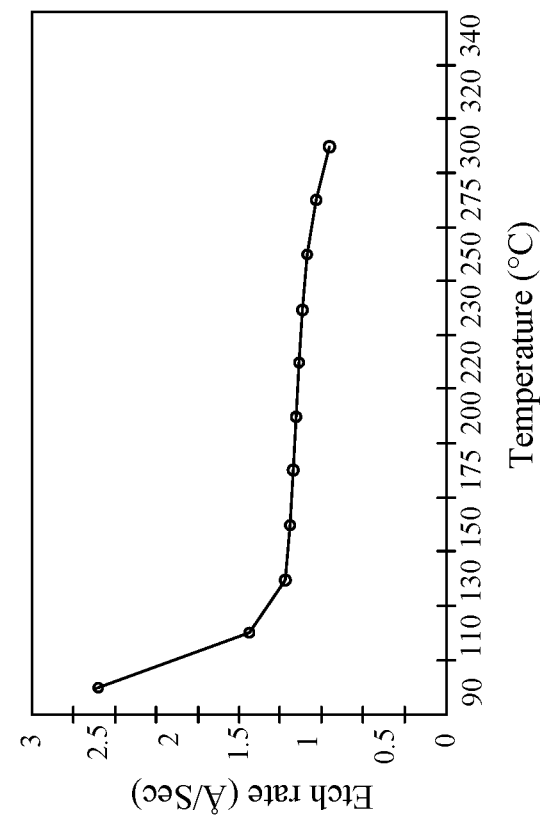
FIG. 4 is a line chart showing relationship between a temperature and an etch rate of 0.08% potassium hydroxide solution that reacts with a second-passivation layer of the QDPPL according to the present disclosure.
Figure 3:
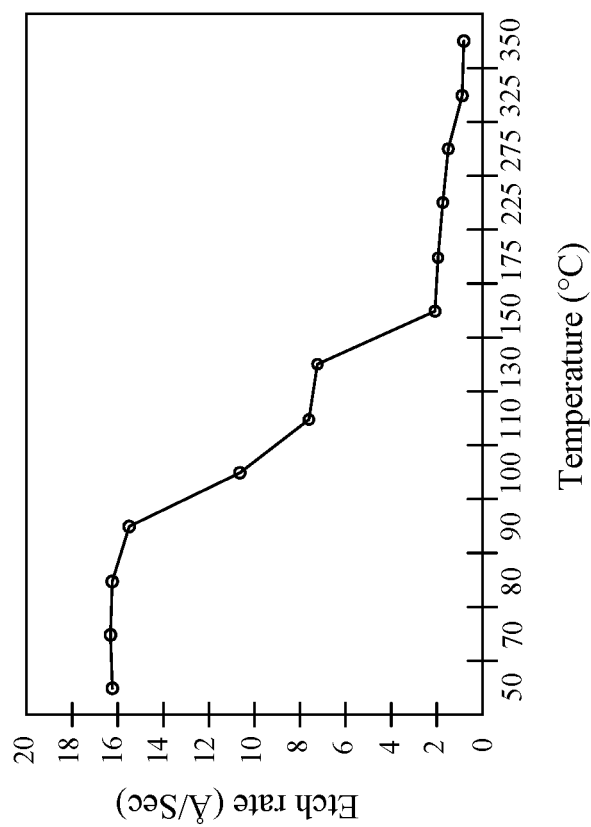
FIG. 3 is a line chart showing relationship between a temperature and an etch rate of 5% potassium hydroxide solution that reacts with a first-passivation layer of the QDPPL according to the present disclosure.

Referring to FIG. 3 and FIG. 4, wherein FIG. 3 is a line chart showing relationship between a temperature and an etch rate of 0.08% potassium hydroxide solution that reacts with a first-passivation layer of the QDPPL, and FIG. 4 is a line chart showing relationship between a temperature and an etch rate of 5% potassium hydroxide solution that reacts with a second-passivation layer of the QDPPL, according to the present disclosure. It should be apparent from FIG. 3 and FIG. 4, the 5% potassium hydroxide solution reacting with the second-passivation layer 15 performs an etch rate, which is less than the that of 0.08% potassium hydroxide solution reacting with a first-passivation layer, thereby the second-passivation layer 15 is known to have a density higher than that of the first-passivation layer 13. Additionally, if the 5% potassium hydroxide solution reacts with the first-passivation layer 13, the solution can entirely erode away a 500 angstrom-thick first-passivation layer 13 formed by Al2O3, in a time less than 1 second.

The precursor employed in the first ALD includes ingredients such as TMA and alcohol, but none of water, therefore the QD particle 11 can avoid contacting water and deterioration. However, the first-passivation layer 13 has a low density, which is not enough to prolong the life cycle of the QD particle 11. In contrary, the precursor used in the second ALD is relatively optional, such as a composition of TMA and water, or TMA and ozone, which can form the second-passivation layer 15 with a higher density and facilitate to prolong the life cycle of the QD particle 11.

Surely in practical use, the QD particle 11 may be made of certain material that does not react with water or ozone, or may also formed with the aforementioned silica layer, such that the composition of TMA and water, or TMA and ozone can be employed as the precursor of the first ALD.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A quantum dot particle with passivation layer (QDPPL), comprising:
   at least one quantum dot particle (QD particle);
   a first-passivation layer disposed on a surface of the at least one QD particle; and
   a second-passivation layer disposed on a surface of the first-passivation layer, wherein the second-passivation layer has a density greater than that of the first-passivation layer.

2. The QDPPL as claimed in claim 1, wherein the first-passivation layer is an organic-inorganic hybrid layer, and the first-passivation layer has a carbon content equal to or more than 10%.

3. The QDPPL as claimed in claim 1, wherein the second-passivation layer has a carbon content less than 10%.

4. The QDPPL as claimed in claim 1, further comprising a silica layer disposed between the first-passivation layer and the at least one QD particle.

5. The QDPPL as claimed in claim 1, wherein the second-passivation layer has a thickness equal to or greater than that of the first-passivation layer.

6. The QDPPL as claimed in claim 1, wherein both of the first-passivation layer and the second-passivation layer comprise aluminum oxide.

7. A method of manufacturing a quantum dot particle with passivation layer, comprising:
   providing at least one quantum dot particle (QD particle);
   performing a first atomic-layer deposition (ALD) to the at least one QD particle and forming a first-passivation layer on a surface of the at least one QD particle; and
   performing a second ALD to the at least one QD particle and forming a second-passivation layer on a surface of the first-passivation layer; wherein the second-passivation layer has a density greater than that of the first-passivation layer.

8. The method according to claim 7, wherein a precursor used in the first ALD comprises Trimethylaluminium and alcohol.

9. The method according to claim 7, wherein a precursor used in the second ALD comprises a composition of Trimethylaluminium and water, or Trimethylaluminium and ozone.

10. The method according to claim 7, wherein a precursor used in the first ALD does not comprise water.

11. The method according to claim 7, wherein the first-passivation layer is an organic-inorganic hybrid layer, and has a carbon content equal to or more than 10%, and wherein the second-passivation layer has a carbon content less than 10%.

12. The method according to claim 7, further comprising a silica layer formed on the surface of the at least one QD particle, wherein a precursor of the first ALD comprises a composition of Trimethylaluminium and water, or Trimethylaluminium and ozone.

13. A method of manufacturing a quantum dot particle with passivation layer, comprising:
   providing at least one quantum dot (QD particle); performing a molecular-layer deposition (MLD) to the at least one QD particle and forming a first-passivation layer on a surface of the at least one QD particle; and
   performing an atomic-layer deposition (ALD) to the at least one QD particle and forming a second-passivation layer on a surface of the first-passivation layer.

14. The method according to claim 13, wherein a precursor used in the MLD comprises trimethylaluminium and alcohol.

15. The method according to claim 13, wherein a precursor used in the ALD comprises a composition of trimethylaluminium and water, or trimethylaluminium and ozone.

16. The method according to claim 13, wherein a precursor used in the MLD does not comprise water.

17. The method according to claim 13, wherein the second-passivation layer has a density greater than that of the first-passivation layer.

18. The method according to claim 13, wherein the first-passivation layer is an organic-inorganic hybrid layer, and has a carbon content equal to or more than 10%, and wherein the second-passivation layer has a carbon content less than 10%.

19. The method according to claim 13, further comprising a step of forming a silica layer on the at least one QD particle in advance for protection to prevent a precursor of the first-passivation layer from contacting the at least one QD particle; the precursor of the first-passivation layer comprises a composition of trimethylaluminium and water, or trimethylaluminium and ozone.

* * * * *